United States Patent
Liu et al.

(10) Patent No.: US 10,804,723 B2
(45) Date of Patent: Oct. 13, 2020

(54) DUAL-OUTPUT PORT CHARGING CIRCUIT AND CONTROL METHOD

(71) Applicant: Shenzhen Vmax Power Co., Ltd., Shenzhen, Guangdong (CN)

(72) Inventors: Jun Liu, Guangdong (CN); Yingying Feng, Guangdong (CN); Jinzhu Xu, Guangdong (CN); Hua Ao, Guangdong (CN)

(73) Assignee: SHENZHEN VMAX POWER CO., LTD., Shenzhen, Guangdong (CN)

( * ) Notice: Subject to any disclaimer, the term of this patent is extended or adjusted under 35 U.S.C. 154(b) by 189 days.

(21) Appl. No.: 16/221,784

(22) Filed: Dec. 17, 2018

(65) Prior Publication Data

US 2019/0222050 A1    Jul. 18, 2019

Related U.S. Application Data

(63) Continuation of application No. PCT/CN2018/083862, filed on Apr. 20, 2018.

(30) Foreign Application Priority Data

Jan. 17, 2018   (CN) .......................... 2018 1 0042858

(51) Int. Cl.
*H02J 7/00*     (2006.01)
*B60L 53/16*    (2019.01)
(Continued)

(52) U.S. Cl.
CPC ........ *H02J 7/007184* (2020.01); *B60L 53/16* (2019.02); *H02J 7/0068* (2013.01);
(Continued)

(58) Field of Classification Search
CPC .............................................. H02J 7/007184
(Continued)

(56) References Cited

U.S. PATENT DOCUMENTS

| 5,003,244 A * | 3/1991 | Davis, Jr. .............. H02J 7/0018 |
| | | 307/46 |
| 5,633,577 A * | 5/1997 | Matsumae ............ H02J 7/0013 |
| | | 322/37 |
| 8,692,512 B2 * | 4/2014 | Tanikawa ................ B60L 58/20 |
| | | 320/109 |

FOREIGN PATENT DOCUMENTS

| CN | 203933409 U | 11/2014 |
| CN | 105763066 A | 7/2016 |

(Continued)

OTHER PUBLICATIONS

International Search Report of PCT/CN2018/083862, dated Sep. 30, 2018.

*Primary Examiner* — Jerry D Robbins
(74) *Attorney, Agent, or Firm* — Locke Lord LLP; Tim Tingkang Xia, Esq.

(57) ABSTRACT

A dual-output port charging circuit includes a primary switching circuit, a secondary first switching circuit, a secondary second switching circuit, a transformer connected to the three circuits, and a controller. The controller receives and samples an output voltage and an output current of the secondary second switching circuit, the output voltage and the output current are compared with a reference value, and a compensation is made, so as to eventually control an on-off time of a switch in the primary switching circuit; and the controller receives and samples an output current of the primary switching circuit, a zero-cross delay is calculated through a zero detection, so as to control an on-off time of a rectification switch in the secondary second switching circuit. One controller is used to flexibly control voltages of two direct current output ports with accurate voltage regulation and strong antijamming capability.

16 Claims, 5 Drawing Sheets

(51) Int. Cl.
    *H02M 3/335* (2006.01)
    *G01R 19/165* (2006.01)
    *H02J 7/02* (2016.01)

(52) U.S. Cl.
    CPC ....... *H02J 7/0072* (2013.01); *H02M 3/33515* (2013.01); *H02M 3/33561* (2013.01); *G01R 19/16528* (2013.01); *H02J 7/0027* (2013.01); *H02J 7/022* (2013.01)

(58) Field of Classification Search
    USPC .......................................................... 320/104
    See application file for complete search history.

(56) References Cited

FOREIGN PATENT DOCUMENTS

| | | |
|---|---|---|
| CN | 107107777 A | 8/2017 |
| EP | 1962415 A2 | 8/2008 |

\* cited by examiner

DUAL-OUTPUT PORT CHARGING CIRCUIT AND CONTROL METHOD

CROSS-REFERENCE TO RELATED PATENT APPLICATION

This application is a continuation application of International Patent Application No. PCT/CN2018/083862, filed on Apr. 20, 2018, which itself claims priority to Chinese Patent Application No. CN201810042858.2 filed in China on Jan. 17, 2018. The disclosures of the above applications are incorporated herein in their entireties by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to the field of electric vehicle charging technology, and more particularly, to a dual-output port charging circuit and a control method.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the energy saving and emission reduction, as well as the need to control air pollution, a new energy vehicle is gradually promoted and applied in the market, and an electric vehicle is the main force of the new energy vehicle. An on-board charger of the electric vehicle is an important component of the electric vehicle, the on-board charger generally has two output ports, one is used for charging a battery, and the other is used for supplying power to the vehicle. In the prior art, voltages/currents of the two ports are separately regulated, and there are defects of complicated setting and inconvenient regulation.

Therefore, it is urgent to develop a charging circuit using only one controller to control output voltages of both ends, and a control method thereof.

SUMMARY

The present invention is intended to solve the problems above in the prior art, and provides a dual-output port charging circuit and a control method thereof.

In order to solve the technical problems above, the present invention provides the technical solutions as follows: a dual-output port charging circuit is designed, which comprises a primary switching circuit, a secondary first switching circuit, a secondary second switching circuit, and a transformer connected to the three circuits; wherein the primary switching circuit has a first set of power switches and a second set of switches, on-off actions of the two sets of power switches are opposite to each other; the secondary second switching circuit has a first rectification switch and a second rectification switch, on-off actions of the two rectification switches are opposite to each other; the dual-output port charging circuit further comprises a secondary first current collector and a secondary first voltage collector sampling a secondary first switching circuit parameter, a secondary second current collector and a secondary second voltage collector sampling a secondary second switching circuit parameter, a primary current collector sampling an output current of the primary switching circuit, and a controller connected to each of the collectors and each of the switches; the controller compares an output current and an output voltage of the secondary first switching circuit with a reference value and makes a compensation, a modulating wave sequence is configured by a compensated value obtained to generate a positive modulating wave and a modulating wave, and the positive and negative modulating waves are respectively used to control turning on and off of the first set of power switches and the second set of switches; and the controller calculates a positive zero-cross delay and a negative zero-cross delay according to the positive modulating wave, the positive modulating wave plus the positive zero-cross delay above controls turning on and off of the first rectification switch, and the negative modulating wave plus the negative zero-cross delay controls turning on and off of the second rectification switch.

The comparison and the compensation comprise conducting a margin calculation between the output current of the secondary first switching circuit and a first reference value, making a loop compensation for a difference value between the output current of the secondary first switching circuit and the first reference value, conducting minimizing operation to the compensated value obtained and a preset voltage loop preset value, taking a minimum value as a voltage loop reference value, conducting a margin calculation between the output voltage of the secondary first switching circuit and the voltage loop reference value, making a loop compensation for a difference value between the output voltage of the secondary first switching circuit and the voltage loop reference value, and configuring the modulating wave sequence by the compensated value obtained to generate the positive modulating wave and the negative modulating wave.

The secondary second switching circuit further comprises an output switch, the controller compares an output voltage of the secondary second switching circuit and an output current of the secondary second switching circuit collected with a reference value and makes a compensation, the compensated value obtained is used as a wave chopping delay time, the positive modulating wave plus the positive zero-cross delay and the wave chopping delay time controls turning on and off of the output switch, and the output switch and the first rectification switch are turned off at the same time.

The controller conducts a margin calculation between the output voltage of the secondary second switching circuit and a second reference value, makes a loop compensation for a difference value between the output voltage of the secondary second switching circuit and a second reference value, conducts minimizing operation to the compensated value obtained and a preset current loop preset value, takes a minimum value as a current loop reference value, conducts a margin calculation between the output current of the secondary second switching circuit collected and the voltage loop reference value, makes a loop compensation for a difference value between the output current of the secondary second switching circuit and the voltage loop reference value, and uses the compensated value obtained as the wave chopping delay time.

2P2Z loop compensation is used in the loop compensation.

the controller determines a zero-cross moment of the primary switching circuit through the output current of the primary switching circuit collected, and the positive zero-cross delay and the negative zero-cross delay are calculated according to a rising edge of the modulating wave to the zero-cross moment.

Regarding to an internal memory comparison diagram of the controller, an output power of the primary switching circuit is divided into multiple levels, and a comparison curve is drawn for each level to determine a working frequency of the positive modulating wave, and corresponding positive zero-cross delay and the negative zero- cross delay are found out according to the working frequency.

A control method for a dual-output port charging circuit comprises the following steps of:

sampling an output current and an output voltage of a secondary first switching circuit, comparing the output current and the output voltage of the secondary first switching circuit with a reference value and making a compensation, configuring a modulating wave sequence by a compensated value obtained to generate a positive modulating wave and a negative modulating wave, and respectively using the positive and negative modulating waves to control turning on and off of first and second sets of power switches in a primary switching circuit, wherein on-off actions of the first set of power switches and the second set of switches are opposite to each other; and calculating a positive zero-cross delay and a negative zero-cross delay according to the positive modulating wave, using the positive modulating wave plus the positive zero-cross delay to control turning on and off of a first rectification switch of a secondary second switching circuit, and using the negative modulating wave plus the negative zero-cross delay to control turning on and off of a second rectification switch of the secondary second switching circuit, wherein on-off actions of the first rectification switch and the second rectification switch are opposite to each other.

The comparison and the compensation comprise conducting a margin calculation between the output current of the secondary first switching circuit and a first reference value, making a loop compensation for a difference value between the output current of the secondary first switching circuit and the first reference value, conducting minimizing operation to the compensated value obtained and a preset voltage loop preset value, taking a minimum value as a voltage loop reference value, conducting a margin calculation between the output voltage of the secondary first switching circuit and the voltage loop reference value, making a loop compensation for a difference value between the output voltage of the secondary first switching circuit and the voltage loop reference value, and configuring the modulating wave sequence by the compensated value obtained to generate the positive modulating wave and the negative modulating wave.

An output voltage of the secondary second switching circuit and an output current of the secondary second switching circuit are collected, the output voltage of the secondary second switching circuit and the output current of the secondary second switching circuit are compared with a reference value and a compensation is made, the compensated value obtained is used as a wave chopping delay time, the positive modulating wave plus the positive zero-cross delay and the wave chopping delay time controls turning on and off of the output switch, and the output switch and the first rectification switch are turned off at the same time.

The output voltage of the secondary second switching circuit is collected, a margin calculation is conducted between the output voltage of the secondary second switching circuit and a second reference value, a loop compensation is made for a difference value between the output voltage of the secondary second switching circuit and the second reference value, minimizing operation is conducted to the compensated value obtained and a preset current loop preset value, and a minimum value is taken as a current loop reference value; a margin calculation is conducted between the output current of the secondary second switching circuit and the voltage loop reference value, a loop compensation is made for a difference value between the output current of the secondary second switching circuit and the voltage loop reference value, and the compensated value obtained is used as the wave chopping delay time.

2P2Z loop compensation is used in the loop compensation.

The output current of the primary switching circuit is collected to determine a zero-cross moment of the primary switching circuit, and the positive zero-cross delay and the negative zero-cross delay are calculated according to a rising edge of the modulating wave to the zero-cross moment.

A memory comparison diagram is drawn, an output power of the primary switching circuit is divided into multiple levels, and a comparison curve is drawn for each level to determine a working frequency of the positive modulating wave, and corresponding positive zero-cross delay and the negative zero-cross delay are found out according to the working frequency.

Compared with the prior art, the present invention can flexibly control voltages of two direct current output ports by one controller with accurate voltage regulation and strong antijamming capability, and has the advantages of simple structure, convenient arrangement, small volume, low cost and light weight at the same time.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

In order to make the object, technical solution and advantages more clearly, the present invention is further described in detail with reference to the drawings and in the combination of the embodiments. It shall be understood that the embodiments described here are only for explaining the present invention, and are not used for limiting the present invention.

Figure 1:
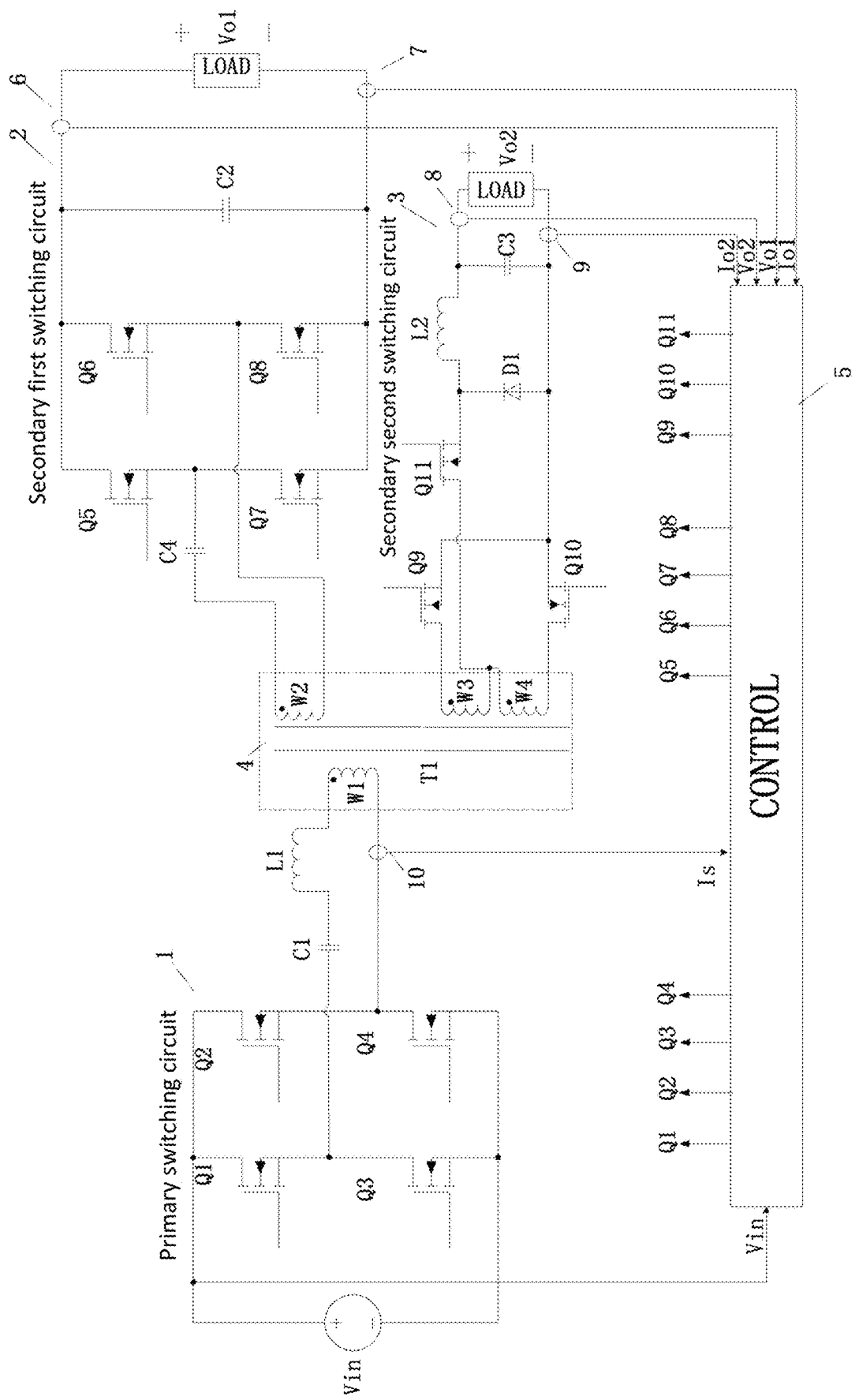
FIG. 1 is a hardware circuit diagram of a preferred embodiment according to the present invention.

With reference to FIG. 1, the present invention discloses a dual-output port charging circuit, which comprises a primary switching circuit 1, a secondary first switching circuit 2, a secondary second switching circuit 3, a transformer 4 connected to the three circuits (T1 in the drawing), and a controller 5. The charging circuit can be used as an on-board charger, the primary switching circuit is connected to a Power Factor Correction (PFC) switching circuit of previous level, the secondary first switching circuit charges an on-board battery, and the secondary second switching circuit supplies power to other appliances in a vehicle. The primary switching circuit has a first set of power switches Q1 and Q4, and a second set of power switches Q2 and Q3, and on-off actions of the two sets of power switches are opposite to each other. The secondary second switching circuit has a first rectification switch Q10 and a second rectification switch Q9, and on-off actions of the two rectification switches are opposite to each other. The secondary first switching circuit comprises a secondary first current collector 7 and a secondary first voltage collector 6 sampling an output current and an output voltage of the secondary first switching circuit, a secondary second current collector 9 and a secondary second voltage collector 8 sampling an output current and an output voltage of the secondary second switching circuit, and a primary current collector 10 sampling an output current of the primary switching circuit. A controller (CONTROL) 5 is connected to each of the collectors and each of the switches. In FIGS. 1, Q5, Q6, Q7 and Q8 are switch tubes in the secondary first switching circuit, C1 and L1 are a resonant capacitance and a resonant inductance in the primary switching circuit, C2 is a filter capacitance in the secondary first switching circuit, L2 and C3 are an inductance and a capacitance in the secondary second switching circuit, C4 is a resonant capacitance of the secondary first switching circuit, T1 is a transformer, W1 is a side winding of the primary switching circuit, W2 is a side winding of the secondary first switching circuit, W3 and W4 are side windings of the secondary second switching circuit, and L1 can be a leakage inductance of T1 in FIG. 1. Vin is a voltage of the primary switching circuit.

Figure 2:
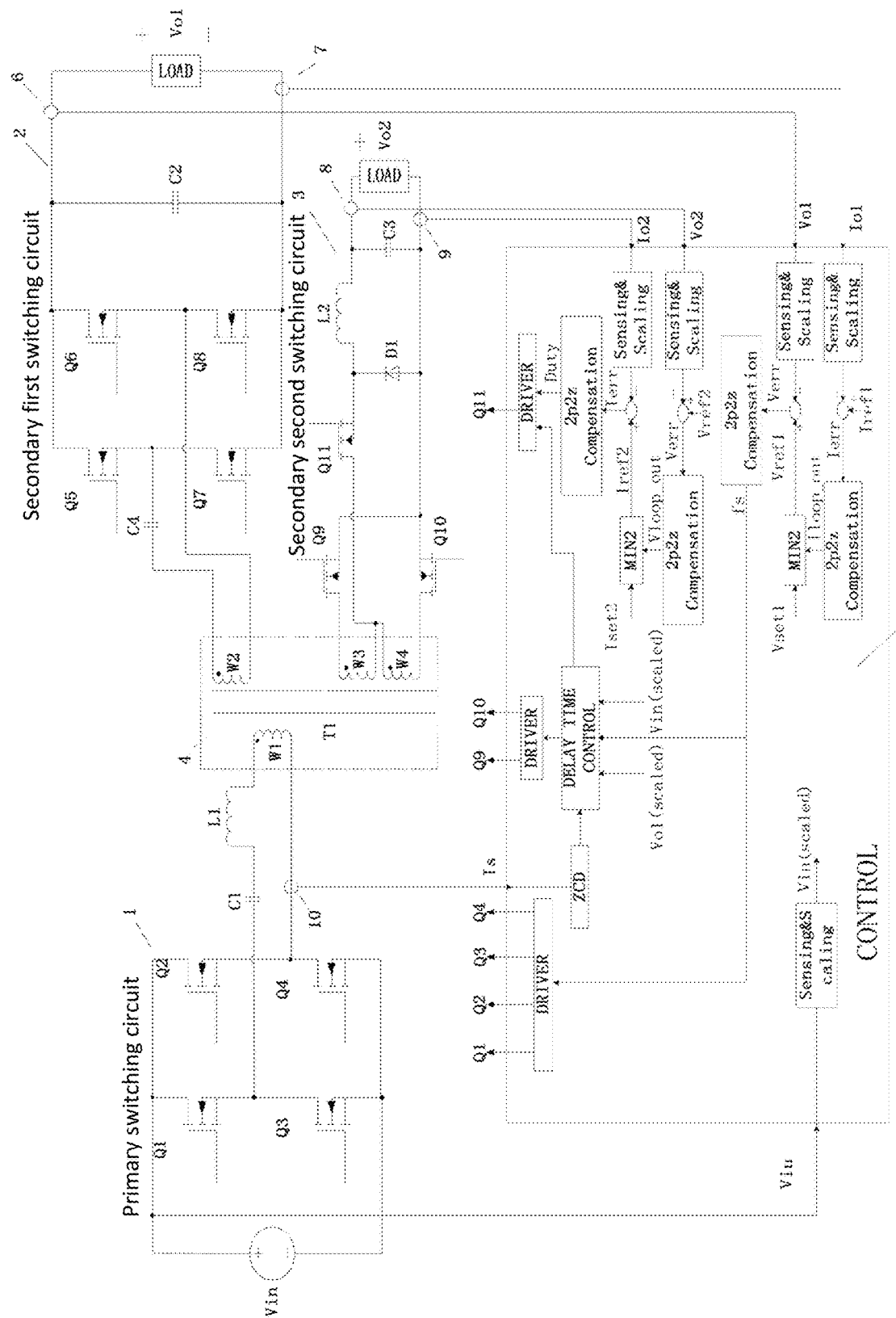
FIG. 2 is a circuit principle diagram of a preferred embodiment according to the present invention.
Figure 3:
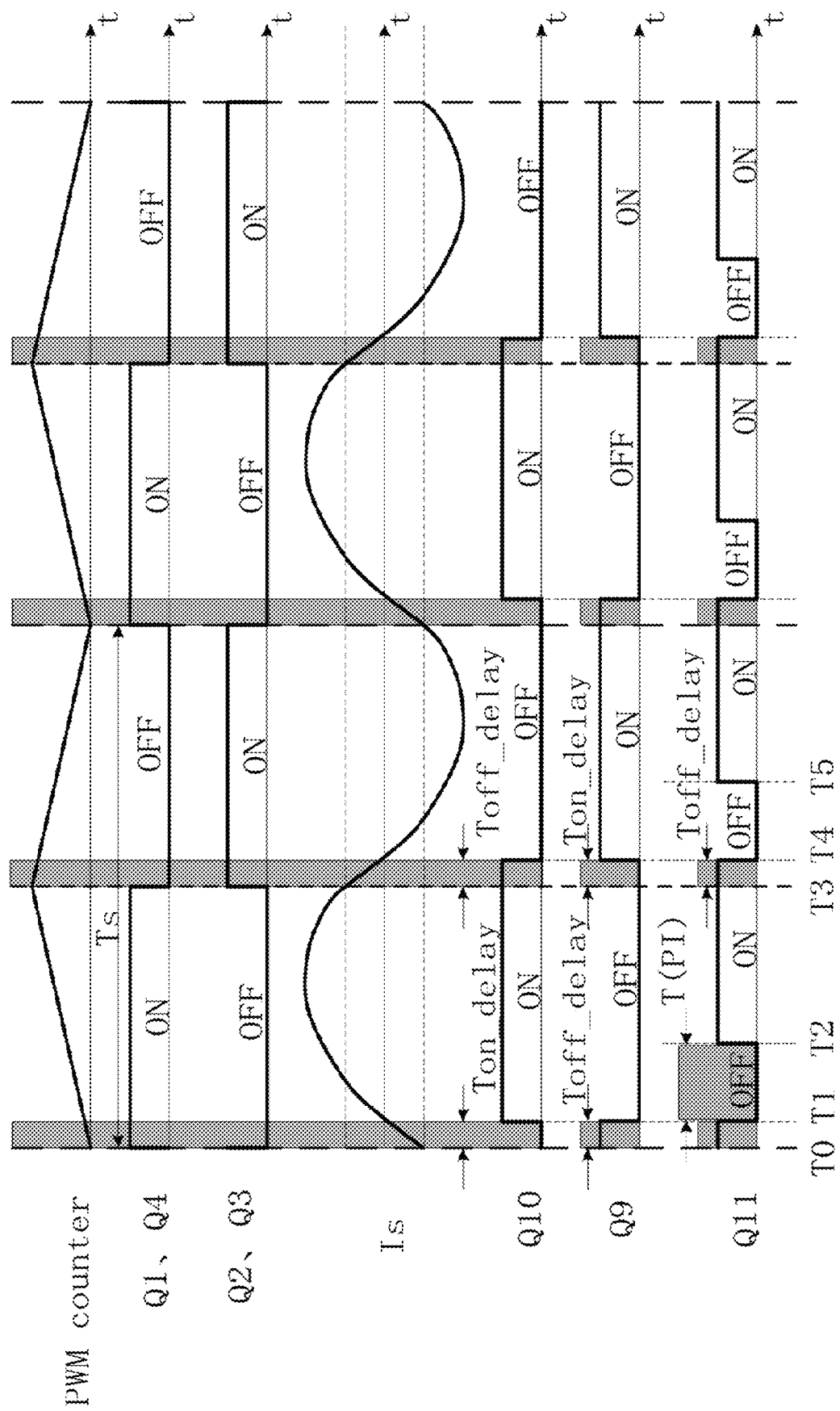
FIG. 3 is a modulating wave sequence diagram of a preferred embodiment according to the present invention.

With reference to a circuit principle diagram of a preferred embodiment according shown in FIG. 2, the controller compares an output current Io1 and an output voltage Vo1 of the secondary first switching circuit with a reference value and makes a compensation, a modulating wave sequence is configured by a compensated value obtained to generate a positive modulating wave and a negative modulating wave. The positive and negative modulating waves are respectively used to control turning on and off of the first set of power switches Q1 and Q4 and the second set of switches Q2 and Q3. The positive modulating wave is used to control turning on and off of the first set of power switches Q1 and Q4, and the negative modulating wave is used to control turning on and off of the second set of switches Q2 and Q3. With reference to a modulating wave sequence diagram as shown in FIG. 3, breakover and ending actions of the first set and the second set of power switches are opposite to each other. The controller calculates a positive zero-cross delay Ton_delay and a negative zero-cross delay Toff_delay according to the positive modulating wave, the positive modulating wave plus the positive zero-cross delay Ton_delay controls turning on and off of the first rectification switch Q10, and the negative modulating wave plus the negative zero-cross delay (Toff_delay) controls turning on and off of the second rectification switch Q9. With reference to a modulating wave sequence diagram as shown in FIG. 3, breakover and ending actions of the first and the second rectification switches are opposite to each other.

In a preferred embodiment, the comparison and the compensation comprise conducting a margin calculation (Io1 is subtracted from Iref1) between the output current Io1 of the secondary first switching circuit and a first reference value Iref1, making a loop compensation for a difference value between the output current Io1 of the secondary first switching circuit and the first reference value Iref1, conducting minimizing operation to the compensated value obtained and a preset voltage loop preset value Vset1, and taking a minimum value as a voltage loop reference value (Vref1), conducting a margin calculation (Vo1 is subtracted from Vref1) between the output voltage Vo1 of the secondary first switching circuit and the voltage loop reference value, making a loop compensation for a difference value between the output voltage Vo1 of the secondary first switching circuit and the voltage loop reference value, and configuring the modulating wave sequence by the compensated value obtained to generate the positive modulating wave and the negative modulating wave.

In a preferred embodiment, the secondary second switching circuit further has an output switch Q11. The controller compares an output voltage Vo2 of the secondary second switching circuit and an output current Io2 of the secondary second switching circuit with a reference value and makes a compensation, the compensated value obtained is used as a wave chopping delay time T(PI), the positive modulating wave plus the positive zero-cross delay and the wave chopping delay time controls turning on and off of the output switch Q11, and the output switch and the first rectification switch Q10 are turned off at the same time.

In a preferred embodiment, the controller conducts a margin calculation (Vo2 is subtracted from Vref2) between the output voltage Vo2 of the secondary second switching circuit and a second reference value Vref2, makes a loop compensation for a difference value between the output voltage Vo2 of the secondary second switching circuit and the second reference value Vref2, conducts minimizing operation to the compensated value obtained and a preset current loop preset value Iset2, takes a smaller one from the compensated value and the current loop preset value as a current loop reference value Iref2, conducts a margin calculation (Io2 is subtracted from Iref2) between the output current Io2 of the secondary second switching circuit collected and the voltage loop reference value Iref2, and makes a loop compensation for a difference value between the output current of the secondary second switching circuit and the voltage loop reference value to obtain the wave chopping delay time T(PI).

In a preferred embodiment, 2P2Z loop compensation is used in the loop compensation.

Figure 5:
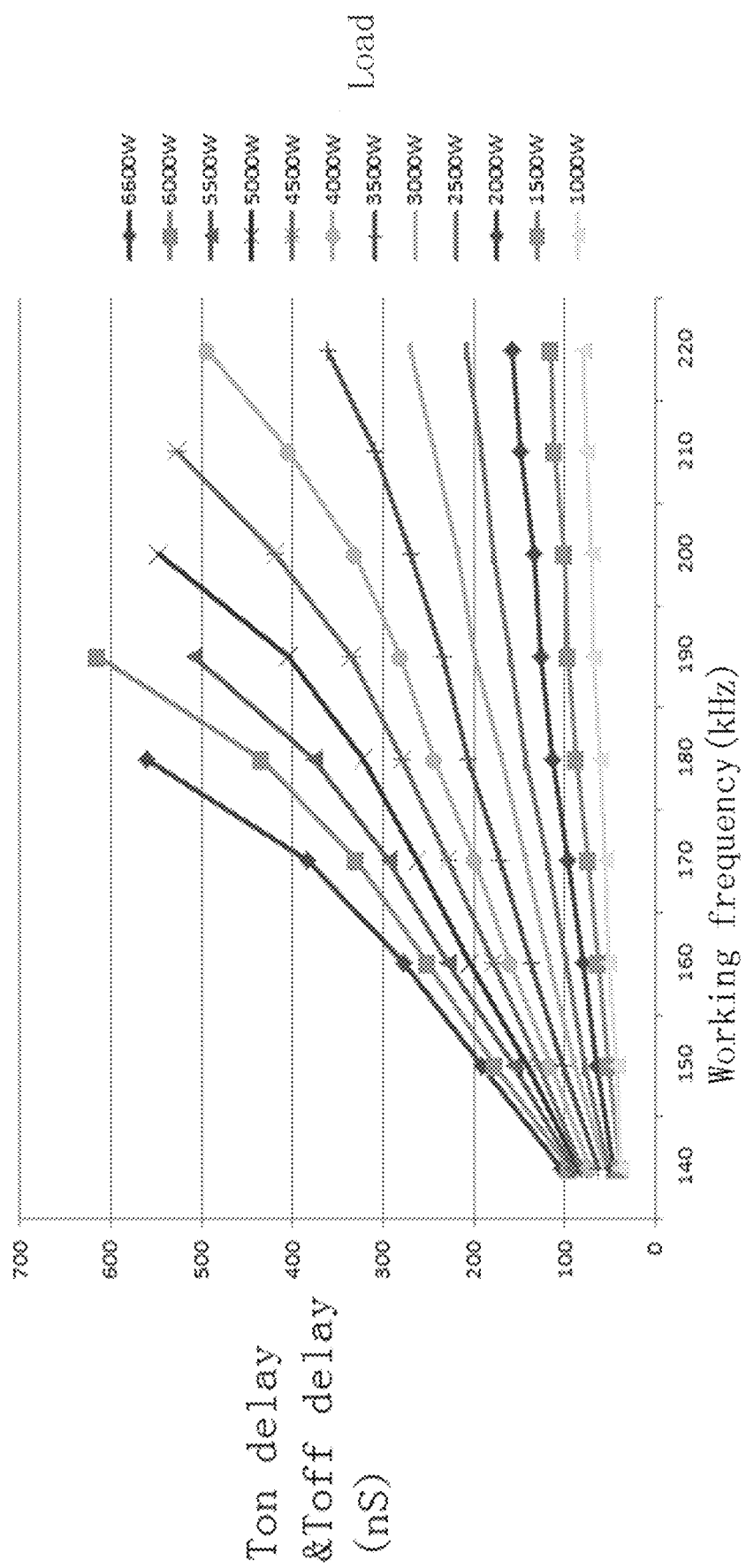
FIG. 5 is a comparison of zero-cross delay of a preferred embodiment according to the present invention.

Two methods for obtaining the zero-cross delay in different embodiments exist, one is that the controller determines a zero-cross moment of the primary switching circuit through the output current Is of the primary switching circuit collected, and the positive zero-cross delay Ton_delay and the negative zero-cross delay Toff_delay are calculated according to a rising edge of the modulating wave to the zero-cross moment. The other is that regarding to an internal memory comparison diagram of the controller (with reference to FIG. 5), an output power of the primary switching circuit is divided into multiple levels, and a comparison curve is drawn for each level to determine a working frequency of the positive modulating wave, and corresponding positive zero-cross delay Ton_delay and the negative zero-cross delay Toff_delay are found out according to the working frequency.

The target of the control above is to: control the voltage/current at a secondary first switching circuit side, and control the voltage/current at a secondary second switching circuit side. The adjustment to two controlled objects is respectively realized through changing on-off frequency of Q1-Q4 and the wave chopping delay time T(PI). Wherein, Q9 and Q10 are synchronous rectifications of the secondary second switching circuit side. The wave chopping delay time T(PI) needs to be associated with the modulating wave sequences of Q9 and Q10, the wave chopping delay time shall fall into a breakover period of Q10, and the modulating wave sequences of Q9 and Q10 are associated with the modulating wave sequences of Q1-Q4, the ending time of breakover of Q10 is one positive zero-cross delay later than the ending time of breakover of the first set of power switches (Q1 and Q4). The control above is completed by one controller.

Figure 4:
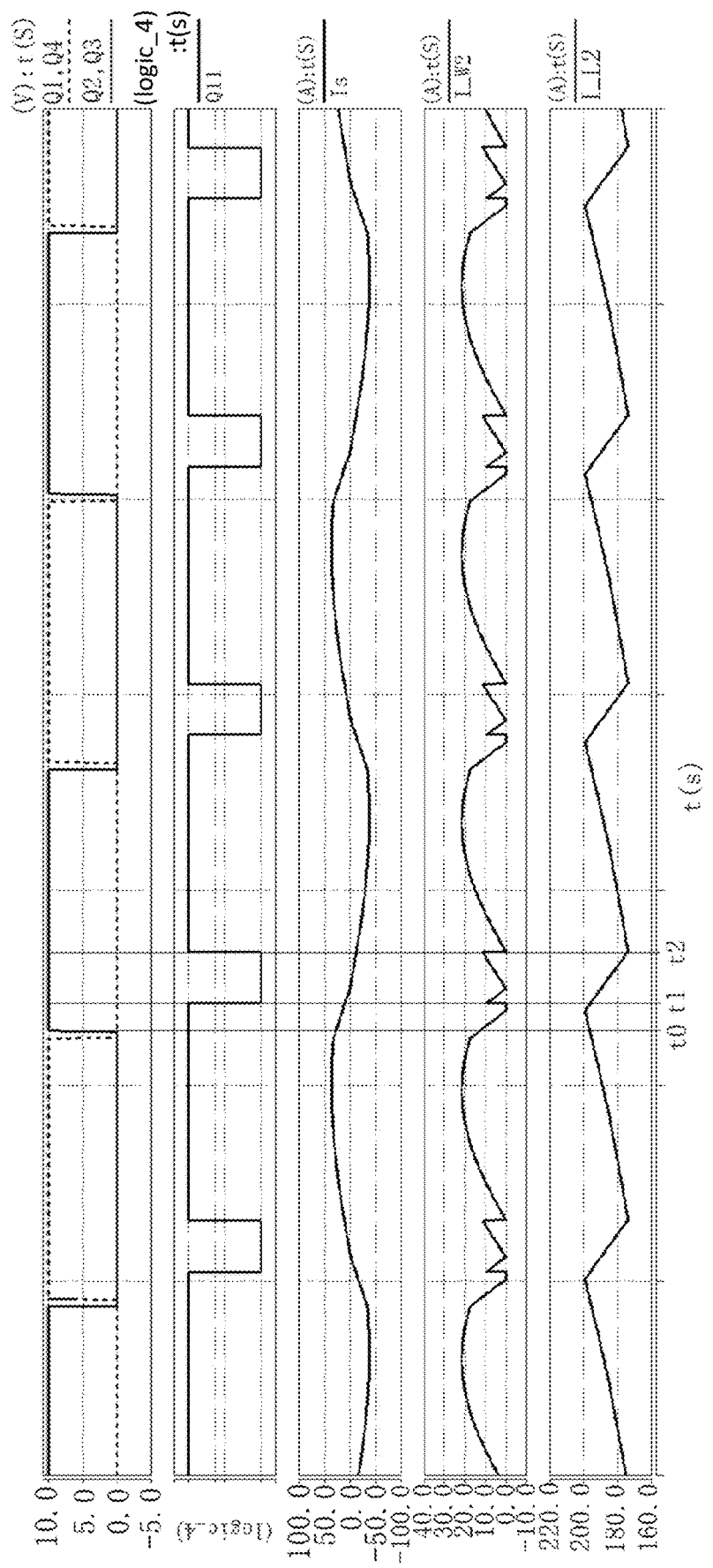
FIG. 4 is an oscillogram after simulation of a preferred embodiment according to the present invention.

With reference to an oscillogram after simulation as shown in FIG. 4, t0 is the turn-on moment of Q2 and Q3, t1 is the turn-off moment of Q11, and represents the negative zero-cross moment of the current in a cavity of the primary switching circuit at the same time, and t2 is the turn-on moment of Q11. It can be seen from the drawing that the current in the cavity of the primary switching circuit is continuous current waveform; the current in a cavity of the secondary first switching circuit can change with the breakover and turning off of Q11; and the current in a cavity of the secondary second switching circuit can increase with the breakover of Q11, and can decrease with the turning off of Q11, involving in a follow current state. A duty ratio of Q11 decides the output voltage/current of the secondary second switching circuit. The modulating wave frequencies of Q1-Q4 and the duty ratio of Q11 jointly decides the output voltage/current of the secondary first switching circuit.

The present invention discloses a control method for a dual-output port charging circuit, which comprises the following steps of:

sampling an output current Io1 and an output voltage Vo1 of a secondary first switching circuit, comparing the output current Io1 and the output voltage Vo1 of the secondary first switching circuit with a reference value and making a compensation, configuring a modulating wave sequence by a compensated value obtained to generate a positive modulating wave and a negative modulating wave, and respectively using the positive and negative modulating waves to control turning on and off of first and second sets of power switches in a primary switching circuit, wherein on-off actions of the first set of power switches Q1 and Q4 and the second set of switches Q2 and Q3 are opposite to each other; and calculating a positive zero-cross delay Ton_delay and a negative zero-cross delay Toff_delay according to the modulating wave, using the positive modulating wave plus the positive zero-cross delay to control turning on and off of a first rectification switch Q10 of a secondary second switching circuit, and using the negative modulating wave plus the negative zero-cross delay to control turning on and off of a second rectification switch Q9 of the secondary second switching circuit, wherein on-off actions of the first rectification switch and the second rectification switch are opposite to each other.

In a preferred embodiment, the comparison and the compensation comprise conducting a margin calculation between the output current Io1 of the secondary first switching circuit and a first reference value Iref1, making a loop compensation for a difference value between the output current Io1 of the secondary first switching circuit and the first reference value Iref1, conducting minimizing operation to the compensated value obtained and a preset voltage loop preset value Vset1, taking a minimum value as a voltage loop reference value Vref1, conducting a margin calculation between the output voltage Vo1 of the secondary first switching circuit and the voltage loop reference value, making a loop compensation for a difference value between the output voltage Vo1 of the secondary first switching circuit and the voltage loop reference value, and configuring the modulating wave sequence by the compensated value obtained to generate the positive modulating wave and the negative modulating wave.

In a preferred embodiment, an output voltage Vo2 of the secondary second switching circuit and an output current Io2 of the secondary second switching circuit are collected, the output voltage Vo2 of the secondary second switching circuit and the output current Io2 of the secondary second switching circuit are compared with a reference value and a compensation is made, the compensated value obtained is used as a wave chopping delay time T(PI), the positive modulating wave plus the positive zero-cross delay and the wave chopping delay time controls turning on and off of the output switch Q11, and the output switch and the first rectification switch Q10 are turned off at the same time.

In a preferred embodiment, the output voltage Vo2 of the secondary second switching circuit is collected, a margin calculation is conducted between the output voltage Vo2 of the secondary second switching circuit and a second reference value Vref2, a loop compensation is made for a difference value between the output voltage Vo2 of the secondary second switching circuit and the second reference value Vref2, minimizing operation is conducted to the compensated value obtained and a preset current loop preset value Iset2, and a minimum value is taken as a current loop reference value Iref2; a margin calculation is conducted between the output current Io2 of the secondary second switching circuit and the voltage loop reference value, a loop compensation is made for a difference value between the output current Io2 of the secondary second switching circuit and the voltage loop reference value, and the compensated value obtained is used as the wave chopping delay time T(PI).

2P2Z loop compensation is used in the loop compensation.

Two methods for obtaining the zero-cross delay in different embodiments exist, one is that the controller determines a zero-cross moment of the primary switching circuit through the output current Is of the primary switching circuit collected, and the positive zero-cross delay Ton_delay and the negative zero-cross delay Toff_delay are calculated according to a rising edge of the modulating wave to the zero-cross moment. The other is that regarding to an internal memory comparison diagram of the controller (with reference to FIG. 5), an output power of the primary switching circuit is divided into multiple levels, and a comparison curve is drawn for each level to determine a working frequency of the positive modulating wave, and corresponding positive zero-cross delay Ton_delay and the negative zero-cross delay Toff_delay are found out according to the working frequency.

The work principle of the control method is the same as the work principle of the charging circuit, which is not repeated here.

The embodiments above are merely for illustration instead of limitation. Any equivalent modifications or alterations to the present invention without departing from the spirit and scope of the application shall be included in the scope of the claims of the application.

What is claimed is:

1. A dual-output port charging circuit, comprising a primary switching circuit, a secondary first switching circuit, a secondary second switching circuit, and a transformer connected to the three circuits; wherein the primary switching circuit has a first set of power switches (Q1 and Q4) and a second set of switches (Q2 and Q3), on-off actions of the two sets of power switches are opposite to each other; the secondary second switching circuit has a first rectification switch (Q10) and a second rectification switch (Q9), on-off actions of the two rectification switches are opposite to each other, wherein the dual-output port charging circuit further comprises a secondary first current collector and a secondary first voltage collector sampling a secondary first switching circuit parameter, a secondary second current collector and a secondary second voltage collector sampling a secondary second switching circuit parameter, a primary current collector sampling an output current of the primary switching circuit, and a controller connected to each of the collectors and each of the switches;

the controller compares an output current (Io1) and an output voltage (Vo1) of the secondary first switching circuit with a reference value and makes a compensation, a modulating wave sequence is configured by a compensated value obtained to generate a positive modulating wave and a negative modulating wave, the positive and negative modulating waves are respectively used to control turning on and off of the first set of power switches (Q1 and Q4) and the second set of switches (Q2 and Q3); and the controller calculates a positive zero-cross delay (Ton_delay) and a negative zero-cross delay (Toff_delay) according to a modulating wave, the positive modulating wave plus the positive zero-cross delay (Ton_delay) above controls turning on and off of the first rectification switch (Q10), and the negative modulating wave plus the negative zero-cross delay (Toff_delay) controls turning on and off of the second rectification switch (Q9).

2. The dual-output port charging circuit according to claim 1, wherein the comparison and the compensation comprise conducting a margin calculation between the output current (Io1) of the secondary first switching circuit and a first reference value (Iref1), making a loop compensation for a difference value between the output current (Io1) of the secondary first switching circuit and the first reference value (Iref1), conducting minimizing operation to the compensated value obtained and a preset voltage loop preset value (Vsetl), taking a minimum value as a voltage loop reference value (Vref1), conducting a margin calculation between the output voltage (Vo1) of the secondary first switching circuit and the voltage loop reference value, making a loop compensation for a difference value between the output voltage (Vo1) of the secondary first switching circuit and the voltage loop reference value, and configuring the modulating wave sequence by the compensated value obtained to generate the positive modulating wave and the negative modulating wave.

3. The dual-output port charging circuit according to claim 2, wherein 2P2Z loop compensation is used in the loop compensation.

4. The dual-output port charging circuit according to claim 1, wherein the secondary second switching circuit further comprises an output switch (Q11); and the controller compares an output voltage (Vo2) of the secondary second switching circuit and an output current (Io2) of the secondary second switching circuit collected with a reference value and makes a compensation, the compensated value obtained is used as a wave chopping delay time (T(PI)), the positive modulating wave plus the positive zero-cross delay and the wave chopping delay time controls turning on and off of the output switch (Q11), and the output switch and the first rectification switch (Q10) are turned off at the same time.

5. The dual-output port charging circuit according to claim 4, wherein the controller conducts a margin calculation between the output voltage (Vo2) of the secondary second switching circuit and a second reference value (Vref2), makes a loop compensation for a difference value between the output voltage (Vo2) of the secondary second switching circuit and a second reference value (Vref2), conducts minimizing operation to the compensated value obtained and a preset current loop preset value (Iset2), takes a minimum value as a current loop reference value (Iref2), conducts a margin calculation between the output current (Io2) of the secondary second switching circuit collected and the voltage loop reference value, makes a loop compensation for a difference value between the output current (Io2) of the secondary second switching circuit and the voltage loop reference value, and uses the compensated value obtained as the wave chopping delay time (T(PI)).

6. The dual-output port charging circuit according to claim 5, wherein 2P2Z loop compensation is used in the loop compensation.

7. The dual-output port charging circuit according to claim 1, wherein the controller determines a zero-cross moment of the primary switching circuit through the output current (Is) of the primary switching circuit collected, and the positive zero-cross delay (Ton_delay) and the negative zero-cross delay (Toff_delay) are calculated according to a rising edge of the modulating wave to the zero-cross moment.

8. The dual-output port charging circuit according to claim 1, wherein regarding to an internal memory comparison diagram of the controller, an output power of the primary switching circuit is divided into multiple levels, and a comparison curve is drawn for each level to determine a working frequency of the positive modulating wave, and corresponding positive zero-cross delay (Ton_delay) and the negative zero-cross delay (Toff_delay) are found out according to the working frequency.

9. A control method for a dual-output port charging circuit, comprising the following steps of:

sampling an output current (Io1) and an output voltage (Vo1) of a secondary first switching circuit, comparing the output current (Io1) and the output voltage (Vo1) of the secondary first switching circuit with a reference value and making a compensation, configuring a modulating wave sequence by a compensated value obtained to generate a positive modulating wave and a negative modulating wave, and respectively using the positive and negative modulating waves to control turning on and off of first and second sets of power switches in a primary switching circuit, wherein on-off actions of the first set of power switches (Q1 and Q4) and the second set of switches (Q2 and Q3) are opposite to each other; and calculating a positive zero-cross delay (Ton_delay) and a negative zero-cross delay (Toff_delay) according to the positive modulating wave, using the positive modulating wave plus the positive zero-cross delay to control turning on and off of a first rectification switch (Q10) of a secondary second switching circuit, and using the negative modulating wave plus the negative zero-cross delay to control turning on and off of a second rectification switch (Q9) of the secondary second switching circuit, wherein on-off actions of the first rectification switch and the second rectification switch are opposite to each other.

10. The control method for a dual-output port charging circuit according to claim 9, wherein the comparison with the reference value and the compensation comprise conducting a margin calculation between the output current (Io1) of the secondary first switching circuit and a first reference value (Iref1), making a loop compensation for a difference value between the output current (Io1) of the secondary first switching circuit and the first reference value (Iref1), conducting minimizing operation to the compensated value obtained and a preset voltage loop preset value (Vset1), taking a minimum value as a voltage loop reference value (Vref1), conducting a margin calculation between the output voltage (Vo1) of the secondary first switching circuit and the voltage loop reference value, making a loop compensation for a difference value between the output voltage (Vo1) of the secondary first switching circuit and the voltage loop reference value, and configuring the modulating wave sequence by the compensated value obtained to generate the positive modulating wave and the negative modulating wave.

11. The control method for a dual-output port charging circuit according to claim 10, wherein 2P2Z loop compensation is used in the loop compensation.

12. The control method for a dual-output port charging circuit according to claim 9, wherein an output voltage (Vo2) of the secondary second switching circuit and an output current (Io2) of the secondary second switching circuit are collected, the output voltage (Vo2) of the secondary second switching circuit and the output current (Io2) of the secondary second switching circuit are compared with a reference value and a compensation is made, the compensated value obtained is used as a wave chopping delay time (T(PI)), the positive modulating wave plus the positive zero-cross delay and the wave chopping delay time controls turning on and off of the output switch (Q11), and the output switch and the first rectification switch (Q10) are turned off at the same time.

13. The control method for a dual-output port charging circuit according to claim 12, wherein the output voltage (Vo2) of the secondary second switching circuit is collected, a margin calculation is conducted between the output voltage (Vo2) of the secondary second switching circuit and a second reference value (Vref2), a loop compensation is made for a difference value between the output voltage (Vo2) of the secondary second switching circuit and the second reference value (Vref2), minimizing operation is conducted to the compensated value obtained and a preset current loop preset value (Iset2), and a minimum value is taken as a current loop reference value (Iref2); a margin calculation is conducted between the output current (Io2) of the secondary second switching circuit and the voltage loop reference value, a loop compensation is made for a difference value between the output current (Io2) of the secondary second switching circuit and the voltage loop reference value, and the compensated value obtained is used as the wave chopping delay time (T(PI)).

14. The control method for a dual-output port charging circuit according to claim 13, wherein 2P2Z loop compensation is used in the loop compensation.

15. The control method for a dual-output port charging circuit according to claim 9, wherein the output current (Is) of the primary switching circuit is collected to determine a zero-cross moment of the primary switching circuit, and the positive zero-cross delay (Ton_delay) and the negative zero-cross delay (Toff_delay) are calculated according to a rising edge of the modulating wave to the zero-cross moment.

16. The control method for a dual-output port charging circuit according to claim 9, wherein a memory comparison diagram is drawn, an output power of the primary switching circuit is divided into multiple levels, and a comparison curve is drawn for each level to determine a working frequency of the positive modulating wave, and corresponding positive zero-cross delay (Ton_delay) and the negative zero-cross delay (Toff_delay) are found out according to the working frequency.

* * * * *